United States Patent
Ishiguro et al.

(10) Patent No.: US 9,502,525 B2
(45) Date of Patent: Nov. 22, 2016

(54) COMPOUND SEMICONDUCTOR DEVICE AND METHOD OF MANUFACTURING THE SAME

(71) Applicant: FUJITSU LIMITED, Kawasaki-shi (JP)

(72) Inventors: Tetsuro Ishiguro, Kawasaki (JP); Atsushi Yamada, Isehara (JP); (Continued)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 13/711,270

(22) Filed: Dec. 11, 2012

(65) Prior Publication Data
US 2013/0256682 A1  Oct. 3, 2013

(30) Foreign Application Priority Data
Mar. 27, 2012 (JP) ................... 2012-071999

(51) Int. Cl.
*H01L 29/15* (2006.01)
*H01L 29/66* (2006.01)
(Continued)

(52) U.S. Cl.
CPC ..... *H01L 29/66477* (2013.01); *H01L 21/0237* (2013.01); *H01L 21/0251* (2013.01);
(Continued)

(58) Field of Classification Search
CPC .............. C30B 25/02; H01L 29/778–29/7789; H01L 21/02458
(Continued)

(56) References Cited

U.S. PATENT DOCUMENTS 5,019,874 A * 5/1991 Inoue et al. ............... 257/190
5,929,467 A * 7/1999 Kawai et al. .............. 257/192
(Continued)

FOREIGN PATENT DOCUMENTS

CN   1900386      1/2007
CN   101445956    6/2009
(Continued)

OTHER PUBLICATIONS

Choi et al. The Effect of an Fe-doped GaN Buffer on OFF-State Breakdown Characteristics in AlGaN/GaN HEMTs on Si Substrate. IEEE Transactions on Electron Devices, vol. 53, No. 12, Dec. 2006.*
(Continued)

*Primary Examiner* — Eric Ward
*Assistant Examiner* — Eric Ashbahian
(74) *Attorney, Agent, or Firm* — Fujitsu Patent Center

(57) ABSTRACT

An embodiment of a method of manufacturing a compound semiconductor device includes: forming an initial layer over a substrate; forming a buffer layer over the initial layer; forming an electron transport layer and an electron supply layer over the buffer layer; and forming a gate electrode, a source electrode and a gate electrode over the electron supply layer. The forming an initial layer includes: forming a first compound semiconductor film with a flow rate ratio being a first value, the flow rate ratio being a ratio of a flow rate of a V-group element source gas to a flow rate of a III-group element source gas; and forming a second compound semiconductor film with the flow rate ratio being a second value different from the first value over the first compound semiconductor film. The method further includes forming an Fe-doped region between the buffer layer and the electron transport layer.

8 Claims, 11 Drawing Sheets

(72) Inventors: Norikazu Nakamura, Sagamihara (JP); Kenji Imanishi, Atsugi (JP)

(51) Int. Cl.
*H01L 29/78* (2006.01)
*H01L 29/778* (2006.01)
*H01L 21/02* (2006.01)
*H01L 23/495* (2006.01)
*H01L 29/20* (2006.01)
*H01L 29/04* (2006.01)
*H01L 29/207* (2006.01)

(52) U.S. Cl.
CPC ....... *H01L 21/0254* (2013.01); *H01L 21/0262* (2013.01); *H01L 21/02458* (2013.01); *H01L 21/02505* (2013.01); *H01L 21/02581* (2013.01); *H01L 23/49562* (2013.01); *H01L 29/66462* (2013.01); *H01L 29/7787* (2013.01); *H01L 29/78* (2013.01); *H01L 29/045* (2013.01); *H01L 29/2003* (2013.01); *H01L 29/207* (2013.01); *H01L 2224/0603* (2013.01); *H01L 2224/32245* (2013.01); *H01L 2224/48247* (2013.01); *H01L 2224/48257* (2013.01); *H01L 2224/48472* (2013.01); *H01L 2224/73265* (2013.01); *H01L 2924/181* (2013.01)

(58) Field of Classification Search
USPC .......................................... 257/76
See application file for complete search history.

(56) References Cited

U.S. PATENT DOCUMENTS

| | | | |
|---|---|---|---|
| 7,791,106 B2* | 9/2010 | Piner et al. | 257/191 |
| 8,173,464 B2 | 5/2012 | Yokoyama | |
| 2006/0189019 A1 | 8/2006 | Lee et al. | |
| 2007/0235775 A1 | 10/2007 | Wu et al. | |
| 2008/0116456 A1* | 5/2008 | Piner et al. | 257/51 |
| 2008/0197359 A1 | 8/2008 | Imanishi et al. | |
| 2009/0108297 A1 | 4/2009 | Sato et al. | |
| 2010/0207124 A1* | 8/2010 | Imanishi et al. | 257/76 |
| 2011/0049527 A1* | 3/2011 | Sato | 257/76 |
| 2011/0049529 A1* | 3/2011 | Sato et al. | 257/76 |
| 2011/0254014 A1 | 10/2011 | Tsuchiya | |
| 2011/0272704 A1* | 11/2011 | Kikkawa | 257/76 |
| 2011/0286484 A1* | 11/2011 | Raring | B82Y 20/00 372/44.011 |
| 2012/0025205 A1 | 2/2012 | Nakata et al. | |
| 2012/0138956 A1* | 6/2012 | Shimizu et al. | 257/77 |
| 2012/0267687 A1* | 10/2012 | Jeon et al. | 257/194 |
| 2013/0026480 A1* | 1/2013 | Fenwick | H01L 21/02381 257/76 |
| 2013/0234111 A1* | 9/2013 | Pfister | H01L 29/20 257/14 |

FOREIGN PATENT DOCUMENTS

| | | |
|---|---|---|
| JP | 2006-237582 | 9/2006 |
| JP | 2008-533738 | 8/2008 |
| JP | 2009-120465 A | 6/2009 |
| JP | 2010-225710 | 10/2010 |
| JP | 2011-023642 | 2/2011 |
| JP | 2011-044647 | 3/2011 |
| JP | 2011-187654 | 9/2011 |
| JP | 2011-228428 | 11/2011 |
| JP | 2011-228442 | 11/2011 |
| JP | 2012-033575 | 2/2012 |
| TW | 454358 | 9/2001 |
| WO | 2006101598 A2 | 9/2006 |

OTHER PUBLICATIONS

Korean Office Action mailed Nov. 18, 2013 for corresponding Korean Application No. 10-2012-156178, with Partial English-language Translation.
TWOA—Office Action of Taiwanese Patent Application 101148626 dated Nov. 10, 2014, with full translation of the Office Action.
TWOA—Office Action of Taiwanese Patent Application No. 101148626 dated Mar. 10, 2015, with full English translation of the Office Action.
JPOA—Office Action of Japanese Patent Application No. 2012-071999 dated Nov. 10, 2015, with English translation of the relevant part of the Office Action.
CNOA—Office Action of Chinese Patent Application No. 201210581650.0 dated Jun. 2, 2015, with English translation.
JPOA—Office Action of Japanese Patent Application No. 2012-071999 dated May 17, 2016, with partial English translation.

\* cited by examiner

US 9,502,525 B2

COMPOUND SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2012-071999, filed on Mar. 27, 2012, the entire contents of which are incorporated herein by reference.

FIELD

The embodiments discussed herein are related to a compound semiconductor device and a method of manufacturing the same.

BACKGROUND

Compound semiconductor devices have been developed in which a GaN layer and an AlGaN layer are formed over a substrate and the GaN layer is used as an electron transport layer. One such compound semiconductor device includes GaN-based high electron mobility transistors (HEMTs).

GaN has superior electrical characteristics. For instance, since GaN has a high saturation electron velocity and a wide band gap, it has a high breakdown voltage characteristic. GaN also has a wurtzite crystalline structure and a polarity in a <0001> direction parallel to the c-axis. Furthermore, with the heterostructure of the GaN layer and the AlGaN layer, piezoelectric polarization is induced in the AlGaN layer due to the lattice distortion of both layers, generating two-dimensional electron gas (2 DEG) of high concentration at an interface between the GaN layer and the AlGaN. Due to the above-described reasons, GaN has been given attention as a material of high-frequency devices and a device for electric power.

However, it is very difficult to manufacture a GaN substrate with a good crystallinity. Major conventional solutions have been such as forming a GaN layer, AlGaN layer and so forth by hetero-epitaxial growth, over a Si substrate, sapphire substrate, SiC substrate or the like. In particular as for Si substrate, those having large diameter and high quality are readily available at low costs. Investigations into structures, having a GaN layer and an AlGaN layer formed over the Si substrate, have therefore been flourishing.

However, it is difficult to suppress a leakage current in a GaN-based HEMT with a Si substrate. Though an investigation has been conducted in which Fe is doped into a lower portion of an electron transport layer in order to a leakage current, doped Fe decreases crystallinity of the electron transport layer and affects other characteristics.

[Patent Literature 1] Japanese Laid-Open Patent Publication No. 2011-23642

[Patent Literature 2] Japanese Laid-Open Patent Publication No. 2010-225710

[Patent Literature 3] Japanese Laid-Open Patent Publication No. 2011-187654

[Patent Literature 4] Japanese Laid-Open Patent Publication No. 2011-228442

SUMMARY

According to an aspect of the embodiments, a method of manufacturing a compound semiconductor device includes: forming an initial layer over a substrate; forming a buffer layer over the initial layer; forming an electron transport layer and an electron supply layer over the buffer layer; and forming a gate electrode, a source electrode and a drain electrode over the electron supply layer. The forming an initial layer includes: forming a first compound semiconductor film with a flow rate ratio being a first value, the flow rate ratio being a ratio of a flow rate of a V-group element source gas to a flow rate of a III-group element source gas; and forming a second compound semiconductor film with the flow rate ratio being a second value different from the first value over the first compound semiconductor film. The method further includes forming an Fe-doped region doped with Fe between the buffer layer and the electron transport layer.

According to another aspect of the embodiments, a compound semiconductor device includes: a substrate; a buffer layer formed over the initial layer; an initial layer formed over the substrate; an electron transport layer and an electron supply layer formed over the buffer layer; and a gate electrode, a source electrode and a drain electrode formed over the electron supply layer. The initial layer includes: a first compound semiconductor film; and a second compound semiconductor film formed over the first compound semiconductor film, a dislocation density of the second compound semiconductor film being lower than a dislocation density of the first compound semiconductor film. An Fe-doped region doped with Fe is formed between the buffer layer and the electron transport layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

The present inventors extensively investigated for obtaining a good crystallinity of an electron transport layer even where Fe is doped. Then, it was found out that it is important to form an initial layer under an appropriate condition so as to control warping of a substrate.

Embodiments will be detailed below, referring to the attached drawings.

First Embodiment

First, a first embodiment will be described. FIGS. 1A to 1D are cross sectional views illustrating, in sequence, a method of manufacturing a GaN-based HEMT (compound semiconductor device) according to the first embodiment.

Figure 1A:
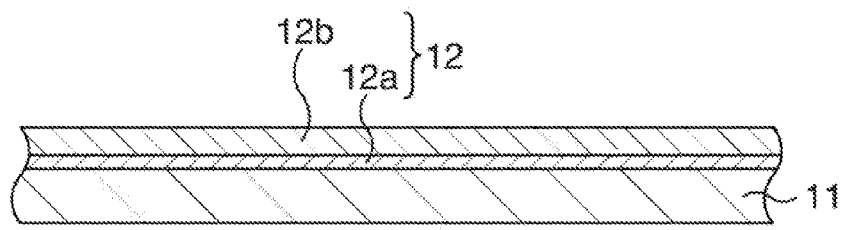
FIGS. 1A to 1D are cross sectional views illustrating, in sequence, a method of manufacturing a compound semiconductor device according to a first embodiment.

In the first embodiment, an initial layer 12 is formed over a substrate 11, as illustrated in FIG. 1A. For the substrate 11, for example, a Si substrate, a SiC substrate, a sapphire substrate, a GaN substrate, or the like may be used. The Si substrate is preferable in view of cost. An AlN layer in which V/III ratio is grated is formed for the initial layer 12, for example. The initial layer 12 may be formed, for example, by a crystal growth method such as an MOVPE (metal organic vapor phase epitaxy) method with a mixed gas containing a III-group element source gas (trimethylaluminum (TMA) gas) and a V-group element gas (ammonia ($NH_3$) gas). In forming the initial layer 12, with controlling the flow rate of the TMA gas and the flow rate of the $NH_3$ gas, a high V/III ratio layer 12a is formed over the substrate 11, and then, a low V/III ratio layer 12b is formed over the high V/III ratio layer 12a. The ratio (V/III ratio) of the flow rate of the $NH_3$ gas to the flow rate of the TMA gas is made lower during forming the low V/III ratio layer 12b than during forming the high V/III ratio layer 12a. The high V/III ratio layer 12a may be formed under a condition in which nucleation is easy, and the low V/III ratio layer 12b may be formed under a condition in which dislocation is not likely to occur and a surface is likely to be flattened, by controlling the flow rates as described above.

Figure 1B:
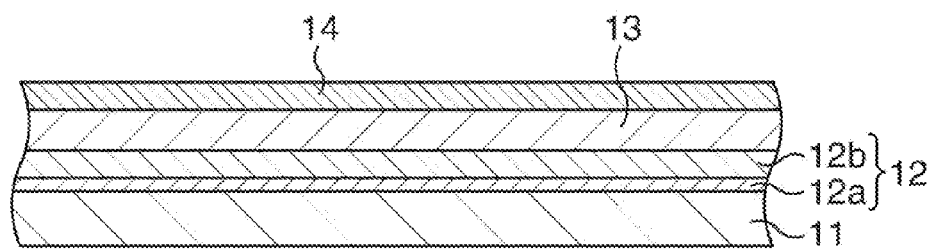

After forming the initial layer 12, a buffer layer 13 is formed over the initial layer 12, and an Fe-doped layer 14 is formed over the buffer layer 13, as illustrated in FIG. 1B. An $Al_xGa_{(1-x)}N$ (0≤x≤1) is formed for the buffer layer 13, for example, and An $Al_yGa_{(1-y)}N$ (0≤y≤1) doped with Fe is formed for the Fe-doped layer 14, for example. The Al fraction (value of "y") of the Fe-doped layer 14 is preferably equal to or lower than the Al fraction (value of "x") of the buffer layer 13. The buffer layer 13 and the Fe-doped layer 14 may be formed, for example, by a crystal growth method such as an MOVPE method with a mixed gas containing a III-group element source gas (TMA gas and trimethylgallium (TMG) gas) and a V-group element gas ($NH_3$ gas). $Cp_2Fe$ (cyclopentadienyl iron, ferrocene) may be used for a source of Fe, for example. The Fe-doped layer 14 may be an example of an Fe-doped region in the present embodiment.

Figure 1C:
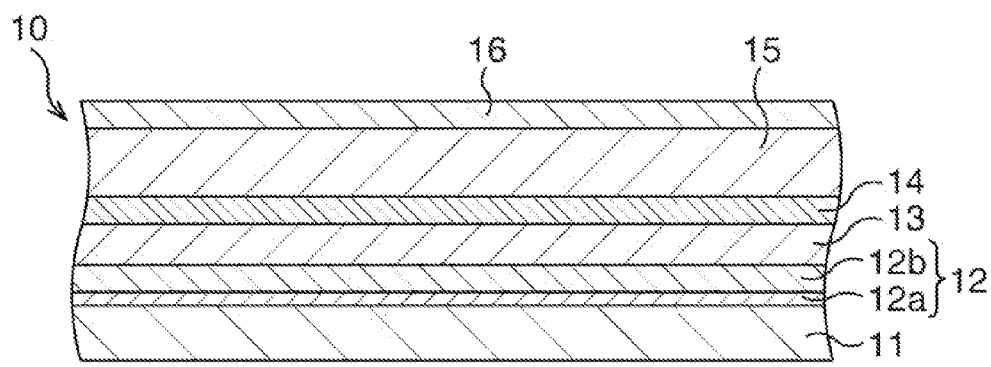

Then, an electron transport layer (channel layer) 15 is formed over the Fe-doped layer 14, and an electron supply layer 16 is formed over the electron transport layer 15, as illustrated in FIG. 1C. A GaN layer is formed for the electron transport layer 15, for example, and $Al_zGa_{(1-z)}N$ (0<x<1) is formed for the electron supply layer 16, for example. The electron transport layer 15 and the electron supply layer 16 may be formed, for example, by a crystal growth method such as an MOVPE method with a mixed gas containing a III-group element source gas (TMA gas and TMG gas) and a V-group element gas ($NH_3$ gas).

Figure 1D:
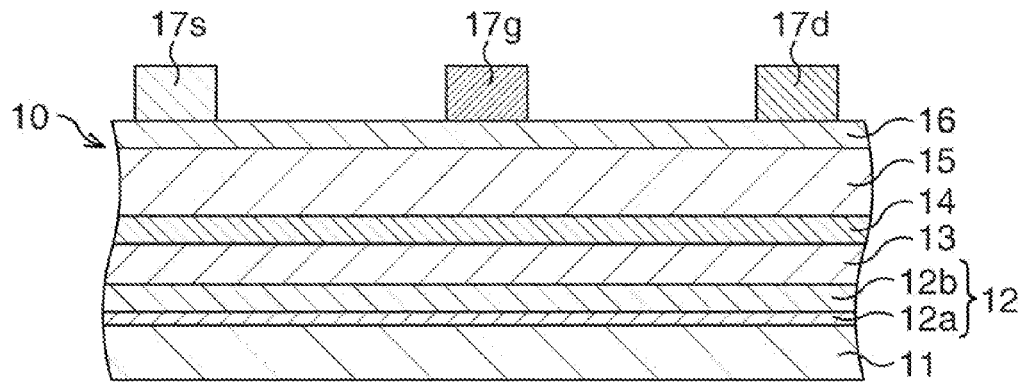

Thereafter, a source electrode 17s, a gate electrode 17g and a drain electrode 17d are formed so that the gate electrode 17g is placed between the source electrode 17s and the drain electrode 17d, as illustrated in FIG. 1D.

The GaN-based HEMT according to the first embodiment may be thus manufactured.

The Fe-doped layer 14 is provided between the buffer layer 13 and the electron transport layer 15 in the first embodiment, and therefore, the Fe-doped layer 14 functions as a high resistant region. Accordingly, a leakage current can be suppressed and a high breakdown voltage can be obtained. Moreover, the crystallinity of the electron transport layer 15 is excellent even though the Fe-doped layer 14 is formed layer, since the initial layer 12 is formed under the appropriate conditions. If the initial layer 12 were not formed, the substrate would warp due to heating for forming the electron transport layer and the like and the warping would trigger variation of temperature at a growth front. And, the variation of temperature would make it difficult to obtain a good crystallinity. On the other hand, the warping of the substrate 11 can be suppressed and the excellent crystallinity can be obtained, since the initial layer 12 is formed under the appropriate conditions in the present embodiment. Also, excellent characteristics such as higher electron mobility and lowered current collapse can be obtained with suppressing a leakage current, since the excellent crystallinity can be obtained.

Second Embodiment

Next, a second embodiment will be described. FIGS. 2A to 2E are cross sectional views illustrating, in sequence, a method of manufacturing a GaN-based HEMI (compound semiconductor device) according to the second embodiment.

Figure 2A:
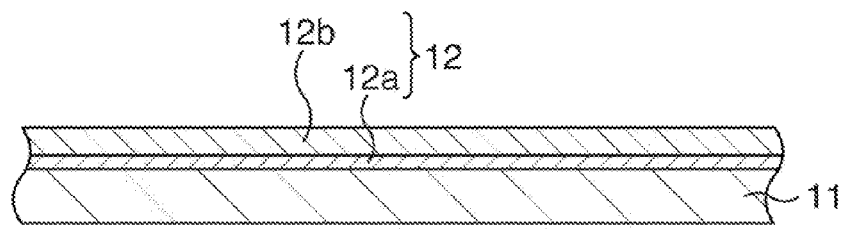
FIGS. 2A to 2E are cross sectional views illustrating, in sequence, a method of manufacturing a compound semiconductor device according to a second embodiment.

In the second embodiment, the initial layer 12, in which the V/III ratio is grated, is formed over the substrate 11, as illustrated in FIG. 2A. In forming the initial layer 12, with controlling the flow rate of the TMA gas and the flow rate of the $NH_3$ gas, the high V/III ratio layer 12a is formed, and then, the low V/III ratio layer 12b is formed over the high V/III ratio layer 12a, as similarly to the first embodiment. The V/III ratio is made lower during forming the low V/III ratio layer 12b than during forming the high V/III ratio layer 12a. The V/III ratio during forming the high V/III ratio layer 12a may be 100 or higher and 1000 or lower, and the V/III ratio during forming the low V/III ratio layer 12b may be 10 or lower, for example. The thickness of the high V/III ratio layer 12a may be from several nanometers to tens of nanometers, for example, and the thickness of the low V/III ratio layer 12b may be from tens of nanometers to hundreds of nanometers, for example. When the initial layer 12 is formed under the conditions, the dislocation density of the high V/III ratio layer 12a is about $1 \times 10^{10}$ cm$^{-3}$, the average roughness Ra of the surface of the high V/III ratio layer 12a is about 1.5 nm (sampling length: 1 nm), the dislocation density of the low V/III ratio layer 12b is about $1 \times 10^{8}$ cm$^{-3}$, and the average roughness Ra of the surface of the low V/III ratio layer 12b is about 0.1 nm (sampling length: 1 nm). In other words, the lower dislocation density and the more flattened surface than those of the high V/III ratio layer 12a can be obtained in the low V/III ratio layer 12b.

Figure 2B:
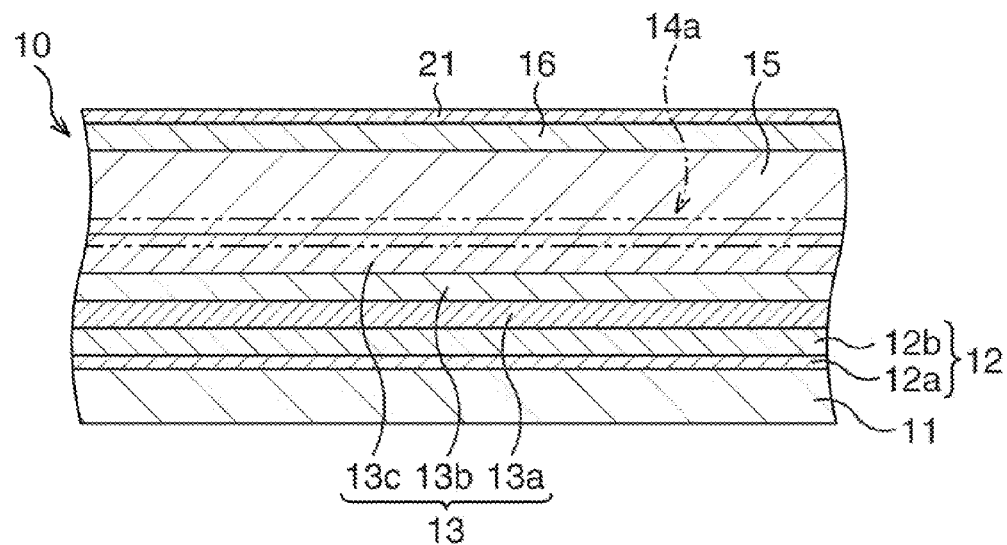

After forming the initial layer 12, the buffer layer 13, the electron transport layer 15, the electron supply layer 16 and a cap layer 21 are formed over the initial layer 12, as illustrated in FIG. 2B.

In the forming the buffer layer 13, with controlling the flow rate of the TMA gas and the flow rate of the TMG gas, a high Al layer 13a is formed over the initial layer 12, a middle Al layer 13b is formed over the high Al layer 13a, and then, a low Al layer 13c is formed over the middle Al layer 13b. For example, an $Al_{0.8}Ga_{0.2}N$ layer may be formed for the high Al layer 13a, an $Al_{0.5}Ga_{0.5}N$ layer may be formed for the middle Al layer 13b, and an $Al_{0.2}Ga_{0.8}N$ layer may be formed for the low Al layer 13b. Thus, the three AlGaN layers in which the Al fraction is lower as far from the initial layer 12 may be used for the buffer layer 13. The number of layers included in the buffer layer 13 is not limited to 3, and it may be 4 or more. Also, the Al fraction is not necessary to be lower as far from the initial layer 12, and a super lattice structure may be adopted, for example. In short, a structure may be adopted in which GaN films and AlN films each having several nanometers in thickness are periodically stacked. It is preferable that the total thickness of the buffer layer 13 is approximately 500 nm to 1000 nm so as to decrease propagation of dislocations and suppress warping and cracking.

In forming the electron transport layer 15, a GaN layer is formed with a mixed gas of a TMG gas and an $NH_3$ gas. It is preferable that the thickness of the electron transport layer 15 is approximately 500 nm to 1000 nm so as to suppress deterioration of crystallinity due to propagation of dislocations. The conditions for forming the electron transport layer 15 are not limited to particular ones. The electron transport layer 15 is preferably formed at a high pressure such as 60 kPa or higher, and the electron transport layer 15 is preferably formed with the V/III ratio being 10000 or higher, so as to obtain more excellent crystallinity.

In the present embodiment, $Cp_2Fe$ is added to the mixed gas from a middle of forming the low Al layer 13c to a middle of forming the electron transport layer 15, and therefore, an Fe-doped region 14a is formed in the low Al layer 13c and the electron transport layer 15. The thickness of the Fe-doped region 14a may be approximately 100 nm to 300 nm, for example. Fe is preferably doped to the Fe-doped region 14a at $1\times10^{16}$ $cm^{-3}$ to $1\times10^{18}$ $cm^{-3}$, for example $5\times10^{17}$ $cm^{-3}$ or around, in view of increasing resistance sufficiently and suppressing diffusion to the vicinity of the channel, where 2 DEG exists. The Fe-doped region 14a may be an example of an Fe-doped region, a region of the buffer layer 13 which is formed before beginning doping Fe may be regarded as an example of a buffer layer, and a region of the electron transport layer 15 which is formed after ending doping Fe may be regarded as an example of an electron transport layer, in the present embodiment.

In forming the electron supply layer 16, an AlGaN layer is formed with a mixed gas of a TMA gas, a TMG gas and an $NH_3$ gas. For example, an undoped i-AlGaN layer may be formed over the electron transport layer 15, and then, an n-type n-AlGaN layer may be formed over the i-AlGaN layer. The thickness of the i-AlGaN layer may be approximately 1 nm to 30 nm, for example 5 nm or around, and the thickness of the n-AlGaN layer may be approximately 3 nm to 30 nm, for example 15 nm or around. It is preferable that the Al fraction of each of the i-AlGaN layer and the n-AlGaN layer is 0.3 or lower so as to avoid deterioration of crystallinity due to a lattice mismatch. Si may be doped to the n-AlGaN layer at approximately $1\times10^{18}$ $cm^{-3}$ to $1\times10^{20}$ $cm^{-3}$, for example $5\times10^{18}$ $cm^{-3}$ or around.

In forming the cap layer 21, a GaN layer is formed with a mixed gas of a TMG gas and an $NH_3$ gas. An n-type n-GaN layer is formed for the GaN layer, for example. The thickness of the cap layer 21 may be approximately 2 nm to 20 nm, for example 15 nm or around. Si may be doped to the n-GaN layer at approximately $1\times10^{18}$ $cm^{-3}$ to $1\times10^{20}$ $cm^{-3}$, for example $5\times10^{18}$ $cm^{-3}$ or around.

A compound semiconductor stacked structure 10 including the initial layer 12, the buffer layer 13, the electron transport layer 15, the electron supply layer 16 and the cap layer 21 may be thus formed. In the compound semiconductor stacked structure 10, the Fe-doped region 14a is formed from a part of the Al 13c in the buffer layer 13 to a part of the electron transport layer 15.

Figure 2C:
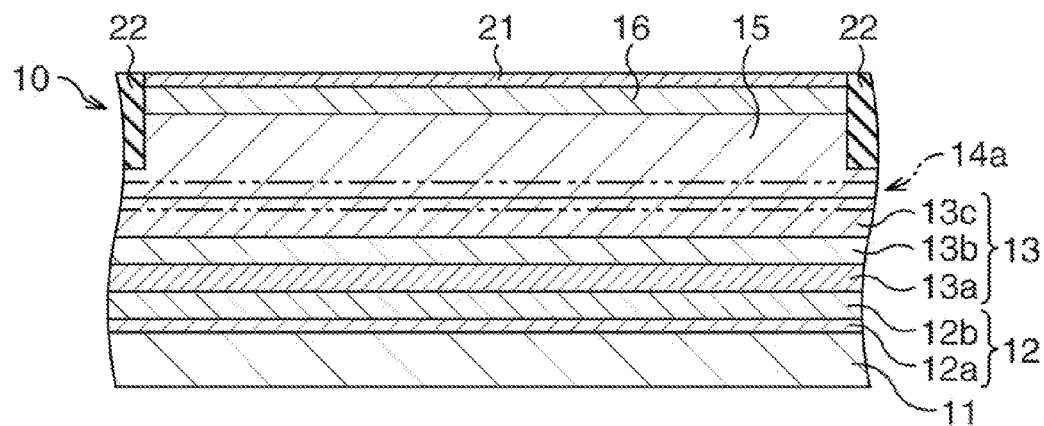

After forming the cap layer 21, an element isolation region 22 which defines an element region is formed in the compound semiconductor stacked structure 10, as illustrated in FIG. 2C. In forming the element isolation region 22, for example, a photoresist pattern is formed over the compound semiconductor stacked structure 10 so as to selectively expose a region where the element isolation region 22 is to be formed, and ion such as Ar ion is implanted through the photoresist pattern used as a mask. Alternatively, the compound semiconductor stacked structure 10 may be etched by dry etching using a chlorine-containing gas with the photoresist pattern used as an etching mask.

Figure 2D:
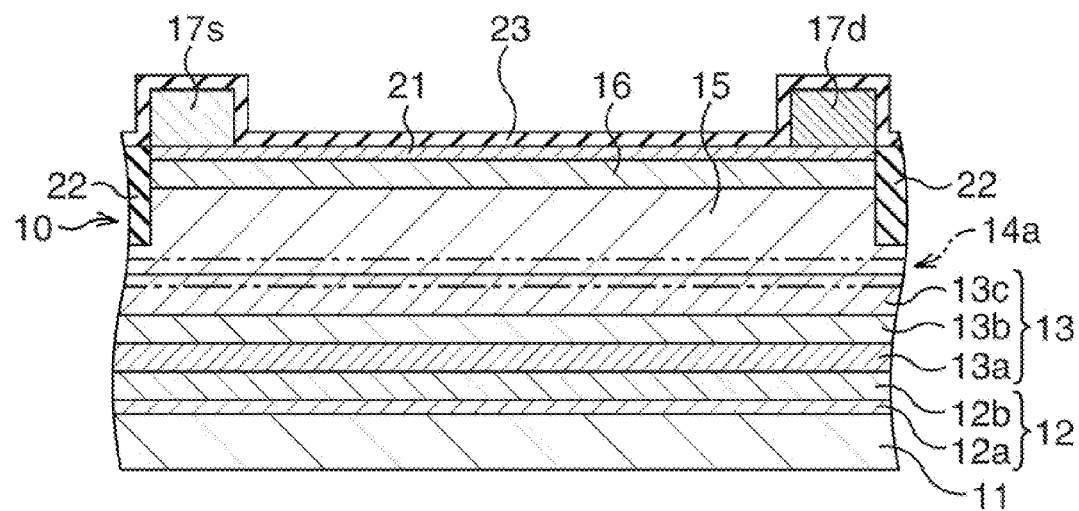

Thereafter, the source electrode 17s and the drain electrode 17d are formed over the cap layer 21 in the element region, as illustrated in FIG. 2D. The source electrode 17s and the drain electrode 17d may be formed by a lift-off method, for example. More specifically, a photoresist pattern is formed so as to expose regions where the source electrode 17s and the drain electrode 17d are to be formed and cover the other region, a metal film is formed over the entire surface by an evaporation method using the photoresist pattern as a growth mask, and the photoresist pattern is then removed together with the portion of the metal film deposited thereon. In forming the metal film, for example, a Ti film of approximately 100 nm thick may be formed, and an Al film of approximately 300 nm thick may be then formed on the Ti film. The metal film is then annealed, for example, in an $N_2$ atmosphere at 400° C. to 1000° C., for example 600° C. or around so as to ensure the ohmic characteristic. Rapid thermal annealing (RTA) may be performed for the annealing the metal film. After forming the source electrode 17s and the drain electrode 17d, an insulating film 23 is formed over the cap layer 21 so as to cover the source electrode 17s and the drain electrode 17d. The insulating film 23 is preferably formed by atomic layer deposition (ALD), plasma-assisted chemical vapor deposition (CVD), or sputtering.

Figure 2E:
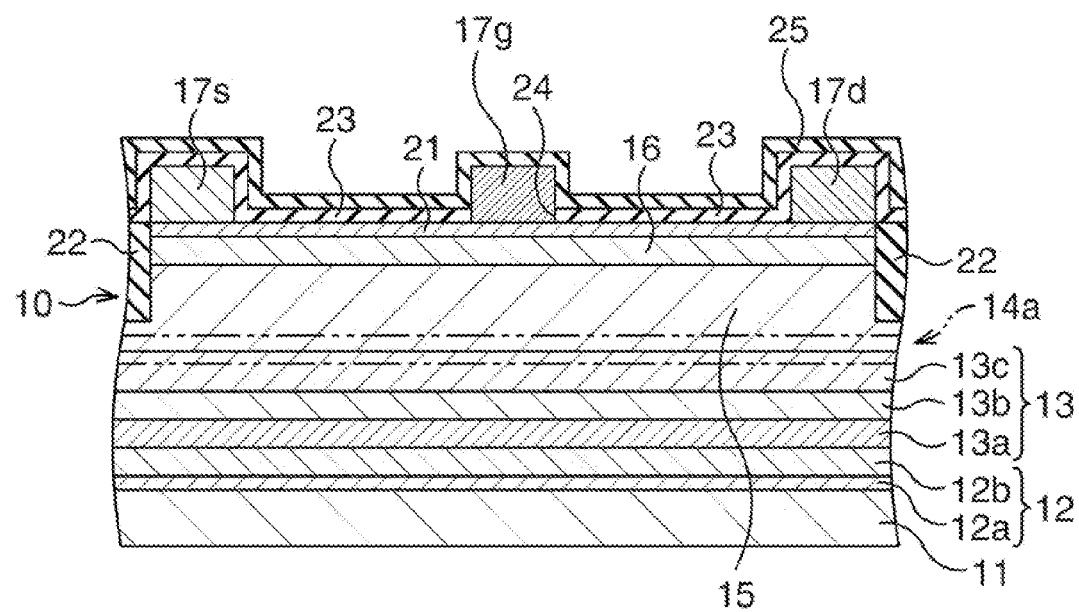
Figure 3:
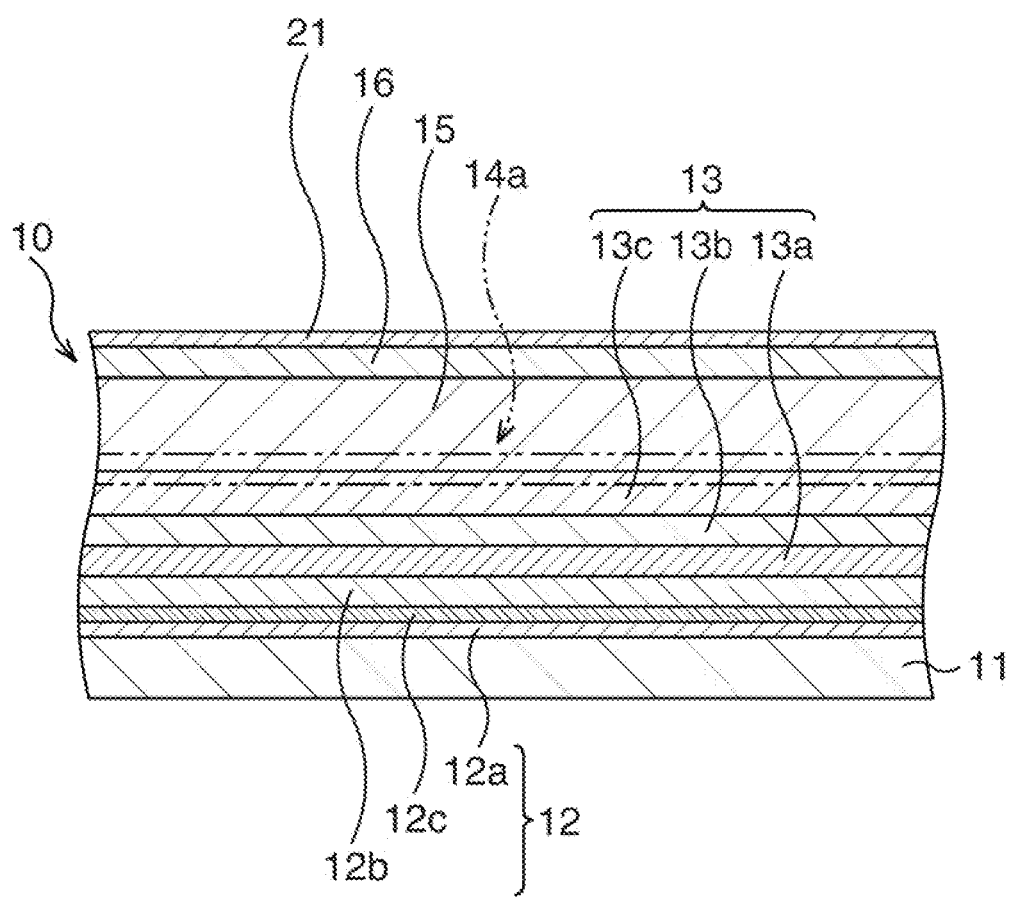
FIG. 3 is a cross sectional view illustrating a modification example of the second embodiment.

Thereafter, an opening 24 is formed in the insulating film 23 at a position where a gate electrode is to be formed, as illustrated in FIG. 2E. The opening 24 may be formed, for example, by dry-etching, wet-etching or ion-milling. Subsequently, the gate electrode 17g is formed in the opening 24. The gate electrode 17g may be formed by a lift-off method, for example. More specifically, a photoresist pattern is formed so as to expose a region where the gate electrode 17g and cover the other region is to be formed, a metal film is formed over the entire surface by an evaporation method using the photoresist pattern as a growth mask, and the photoresist pattern is then removed together with the portion of the metal film deposited thereon. In forming the metal film, for example, a Ni film of approximately 50 nm thick may be formed, and a Au film of approximately 300 nm thick may be then formed. Then, an insulating film 25 is formed over the insulating film 23 so as to cover the gate electrode 17g. The insulating film 25 is preferably formed by atomic layer deposition (ALD), plasma-assisted chemical vapor deposition (CVD), or sputtering, as similarly to forming the insulating film 23. Thereafter, openings are formed in the insulating films 25 and 23 for connection with external terminals or the like.

The GaN-based HEMT according to the first embodiment may be thus manufactured.

Effects similar to the first embodiment can be also obtained in the second embodiment. Moreover, more excellent crystallinity may be obtained when the electron transport layer 15 is formed at a pressure of 60 kPa or higher with the V/III ratio of the mixed gas being 10000 or higher.

The number of layers included in the initial layer 12 is not limited to a particular one. For example, a middle V/III ratio layer 12c may be formed after forming the high V/III ratio layer 12a before forming the low V/III ratio layer 12b so as to make the initial layer 12 include the three compound semiconductor layers. In this case, the V/III ratio during forming the middle V/III ratio layer 12c may be, for example, lower than during forming the high V/III ratio layer 12a and higher than during forming the low V/III ratio layer 12c, and it may be 20 to 80, for example.

Figure 4:
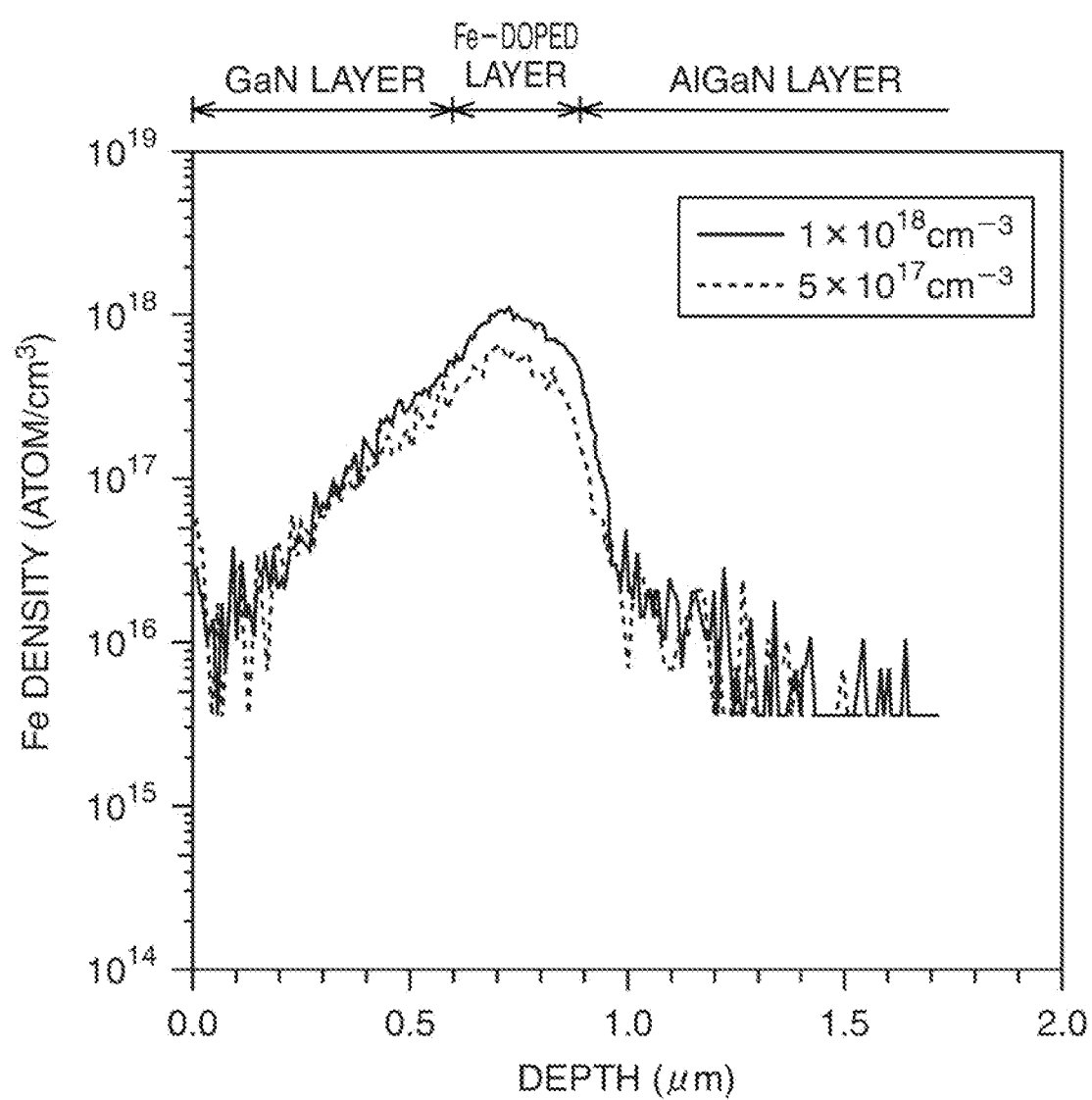
FIG. 4 is a diagram illustrating a result of a SIMS analysis of Fe density.

Doping amount of Fe in each of the Fe-doped layer 14 and the Fe-doped region 14a is not limited to a particular one, and preferably $1 \times 10^{16}$ cm$^{-3}$ to $1 \times 10^{18}$ cm$^{-3}$ as described above. A distribution of Fe in a sample of a compound semiconductor stacked structure is illustrated in FIG. 4. In forming the sample, an Fe-doped GaN layer with 0.3 μm thickness was formed over an AlGaN layer, and a GaN layer with 0.6 μm thickness was formed over the Fe-doped GaN layer. Fe was doped to the Fe-doped GaN layer at $5 \times 10^{17}$ cm$^{-3}$, $1 \times 10^{18}$ cm$^{-3}$. After forming the GaN layer, an Fe density profile in the depth direction was measured by secondary ion mass spectrometry (SIMS). Two-dimensional gas is generated in the vicinity of the upper surface of the GaN layer. Therefore, it is preferable that the Fe density is $1 \times 10^{16}$ cm$^{-3}$ or lower at the upper surface of the GaN layer. As illustrated in FIG. 4, when the doping amount was $1 \times 10^{18}$ cm$^{-3}$ or lower, the Fe density was $1 \times 10^{16}$ cm$^{-3}$ or lower at the upper surface of the GaN layer and that is preferable in view of effects on the two-dimensional gas. On the other hand, when the doping amount was less than $1 \times 10^{16}$ cm$^{-3}$, the resistance is not sufficiently high, and it sometimes cannot decrease the leakage current sufficiently.

Figure 5:
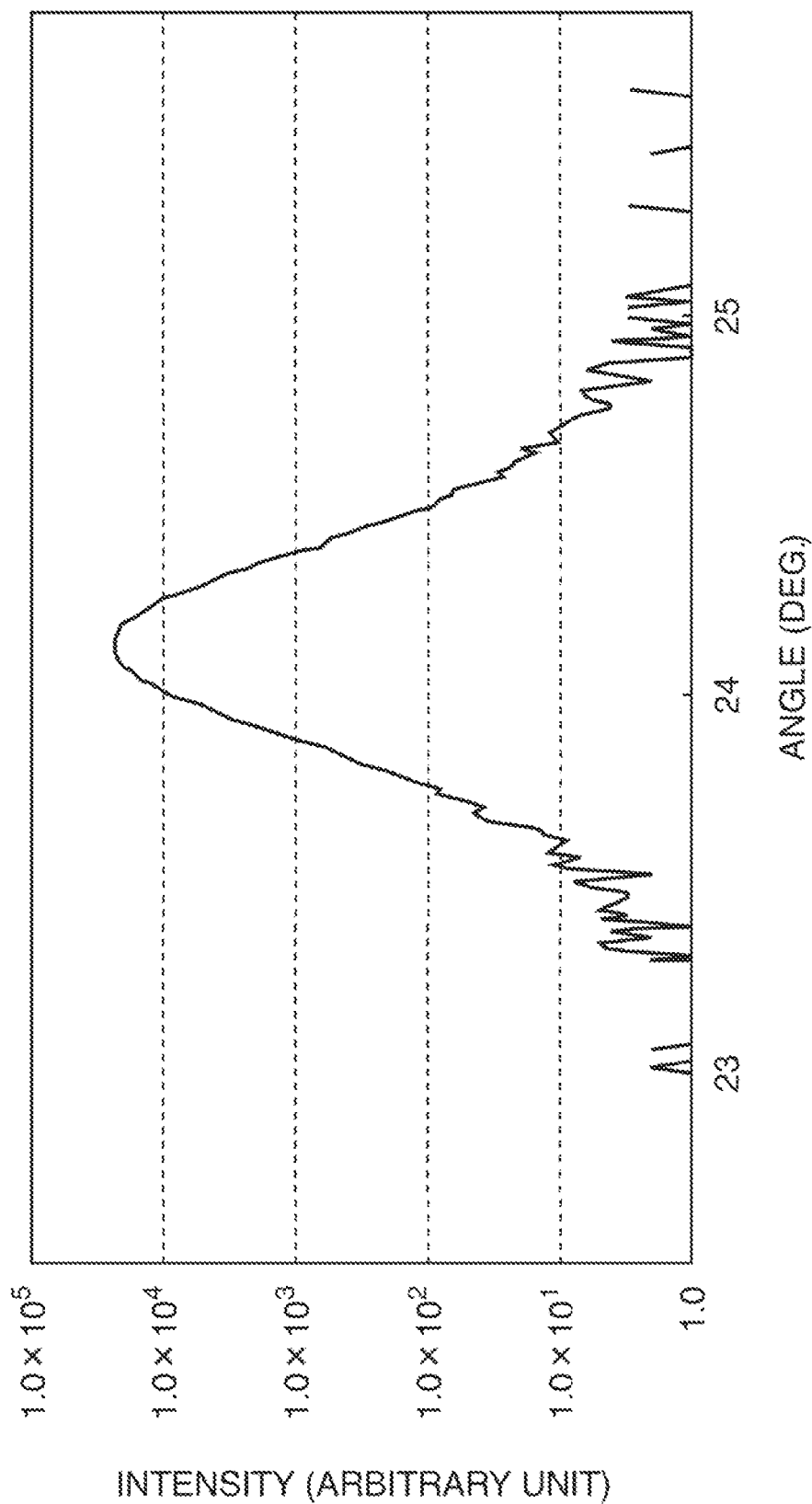
FIG. 5 is a diagram illustrating a result of an analysis based on an asymmetric reflected x-ray rocking curve diffraction method.
Figure 6:
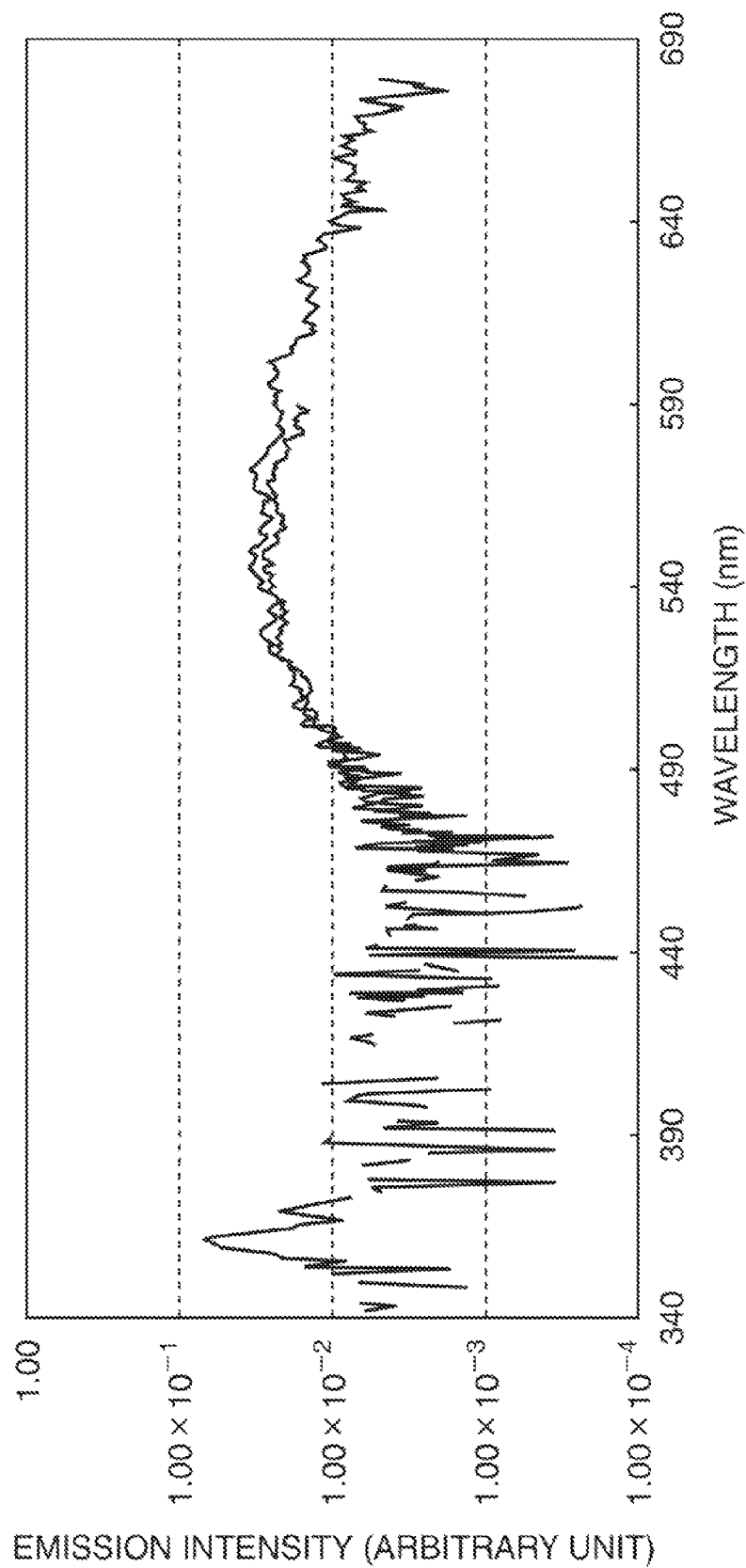
FIG. 6 is a diagram illustrating a result of a measurement of emission intensity.

When the present inventors manufactured a GaN-based HEMI following the second embodiment and investigated crystallinity of an electron transport layer, results illustrated in FIG. 5 and FIG. 6 were obtained. FIG. 5 illustrates a result of an analysis based on an asymmetric reflected x-ray rocking curve diffraction method, and FIG. 6 illustrates a result of a measurement of emission intensity at a room temperature. It can be generally said that a density of edge dislocations is sufficiently low when a full width at half maximum (FWHM) is 1200 arcsec or lower regarding the result of the asymmetric reflected x-ray rocking curve diffraction method. It can be generally said that a density of point defects is sufficiently low when a ratio of strength of band-edge emission to strength of defect emission is 1 or lower regarding the result of the measurement of emission intensity. For example, when the FWHM is 1200 arcsec or lower, the density of edge dislocations is approximately $7.7 \times 10^9$ cm$^{-2}$ or lower. As illustrated in FIG. 5 and FIG. 6, in the GaN-based HEMI manufactured following the second embodiment, the FWHM was approximately 860 arcsec and the ratio of strength of band-edge emission to strength of defect emission was approximately 0.5. In short, these result represents the excellent crystallinity could be obtained.

Third Embodiment

Figure 7:
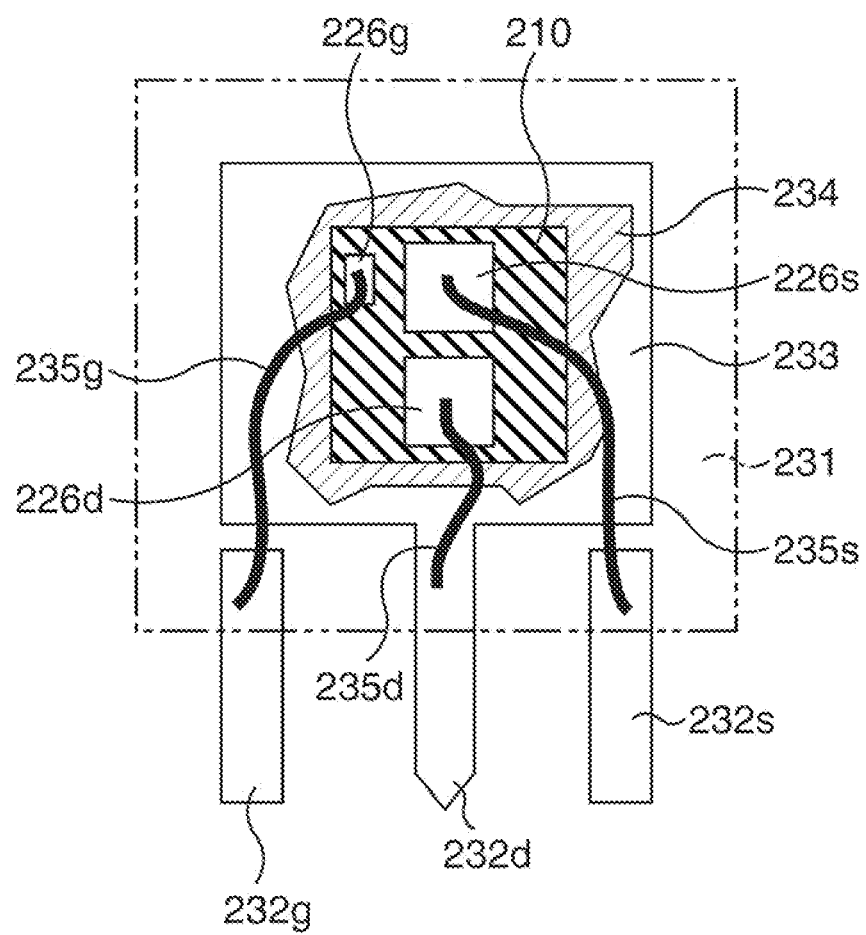
FIG. 7 is a drawing illustrating a discrete package according to a third embodiment.

A third embodiment relates to a discrete package of a compound semiconductor device which includes a GaN-based HEMT. FIG. 7 is a drawing illustrating the discrete package according to the third embodiment.

In the third embodiment, as illustrated in FIG. 7, a back surface of a HEMT chip 210 of the compound semiconductor device according to any one of the first to second embodiments is fixed on a land (die pad) 233, using a die attaching agent 234 such as solder. One end of a wire 235d such as an Al wire is bonded to a drain pad 226d, to which the drain electrode 17d is connected, and the other end of the wire 235d is bonded to a drain lead 232d integral with the land 233. One end of a wire 235s such as an Al wire is bonded to a source pad 226s, to which the source electrode 17s is connected, and the other end of the wire 235s is bonded to a source lead 232s separated from the land 233. One end of a wire 235g such as an Al wire is bonded to a gate pad 226g, to which the gate electrode 17g is connected, and the other end of the wire 235g is bonded to a gate lead 232g separated from the land 233. The land 233, the HEMT chip 210 and so forth are packaged with a molding resin 231, so as to project outwards a portion of the gate lead 232g, a portion of the drain lead 232d, and a portion of the source lead 232s.

The discrete package may be manufactured by the procedures below, for example. First, the HEMT chip 210 is bonded to the land 233 of a lead frame, using a die attaching agent 234 such as solder. Next, with the wires 235g, 235d and 235s, the gate pad 226g is connected to the gate lead 232g of the lead frame, the drain pad 226d is connected to the drain lead 232d of the lead frame, and the source pad 226s is connected to the source lead 232s of the lead frame, respectively, by wire bonding. Then molding with the molding resin 231 is conducted by a transfer molding process. The lead frame is then cut away.

Fourth Embodiment

Figure 8:
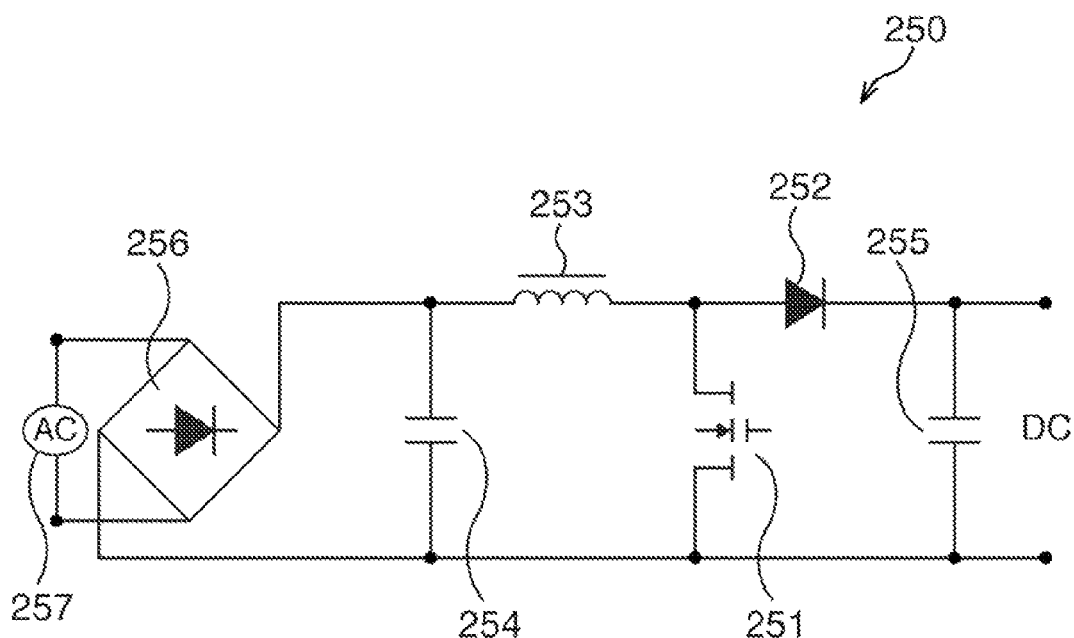
FIG. 8 is a wiring diagram illustrating a power factor correction (PFC) circuit according to a fourth embodiment.

Next, a fourth embodiment will be explained. The fourth embodiment relates to a PFC (power factor correction) circuit equipped with a compound semiconductor device which includes a GaN-based HEMT. FIG. 8 is a wiring diagram illustrating the PFC circuit according to the fourth embodiment.

The PFC circuit 250 includes a switching element (transistor) 251, a diode 252, a choke coil 253, capacitors 254 and 255, a diode bridge 256, and an AC power source (AC) 257. The drain electrode of the switching element 251, the anode terminal of the diode 252, and one terminal of the choke coil 253 are connected with each other. The source electrode of the switching element 251, one terminal of the capacitor 254, and one terminal of the capacitor 255 are connected with each other. The other terminal of the capacitor 254 and the other terminal of the choke coil 253 are connected with each other. The other terminal of the capacitor 255 and the cathode terminal of the diode 252 are connected with each other. A gate driver is connected to the gate electrode of the switching element 251. The AC 257 is connected between both terminals of the capacitor 254 via the diode bridge 256. A DC power source (DC) is connected between both terminals of the capacitor 255. In the embodiment, the compound semiconductor device according to any one of the first to second embodiments is used as the switching element 251.

In the process of manufacturing the PFC circuit 250, for example, the switching element 251 is connected to the diode 252, the choke coil 253 and so forth with solder, for example.

Fifth Embodiment

Figure 9:
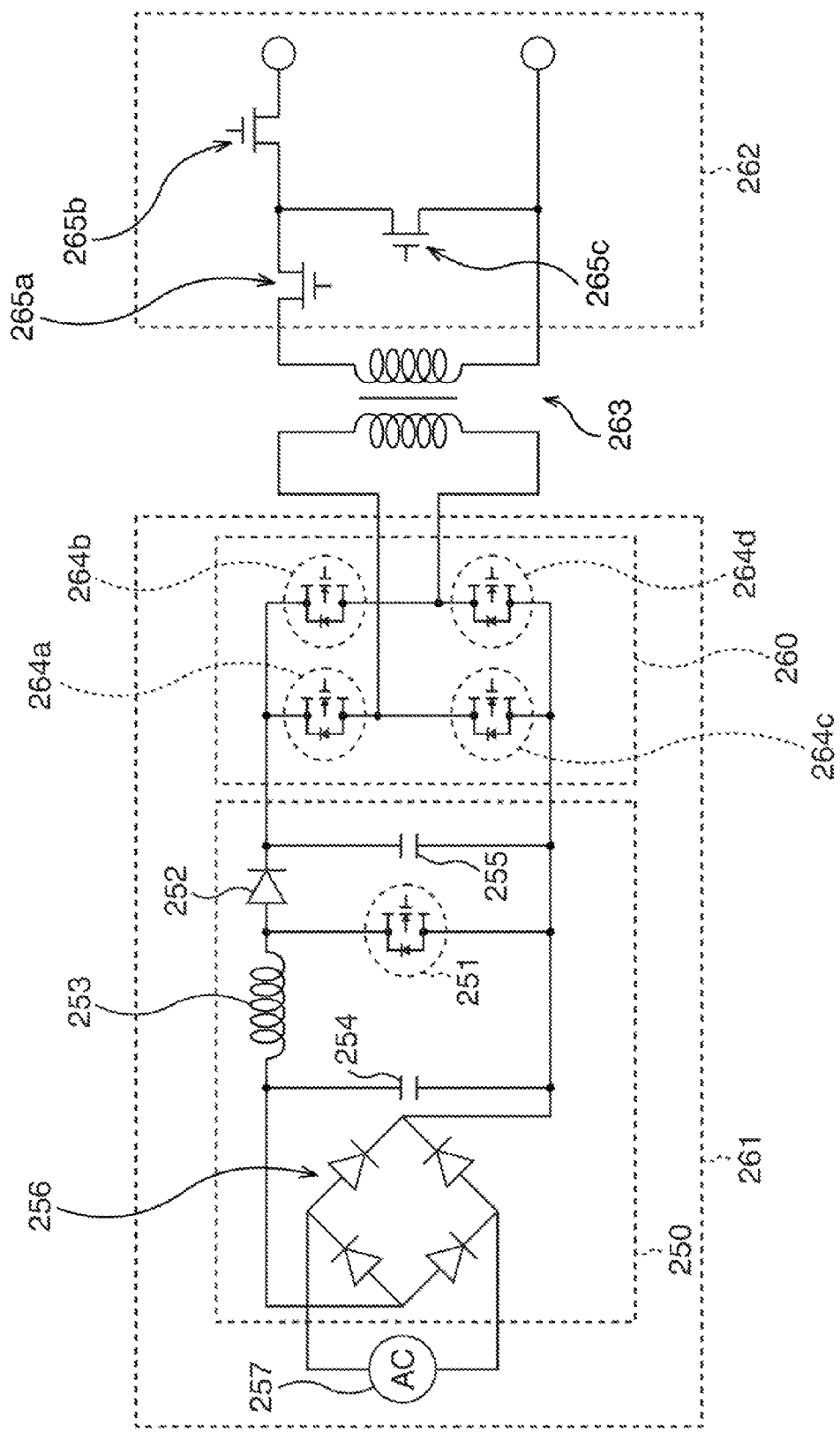
FIG. 9 is a wiring diagram illustrating a power supply apparatus according to a fifth embodiment.

Next, a fifth embodiment will be explained. The fifth embodiment relates to a power supply apparatus equipped with a compound semiconductor device which includes a GaN-based HEMT. FIG. 9 is a wiring diagram illustrating the power supply apparatus according to the fifth embodiment.

The power supply apparatus includes a high-voltage, primary-side circuit 261, a low-voltage, secondary-side circuit 262, and a transformer 263 arranged between the primary-side circuit 261 and the secondary-side circuit 262.

The primary-side circuit 261 includes the PFC circuit 250 according to the fourth embodiment, and an inverter circuit, which may be a full-bridge inverter circuit 260, for example, connected between both terminals of the capacitor 255 in the PFC circuit 250. The full-bridge inverter circuit 260 includes a plurality of (four, in the embodiment) switching elements 264a, 264b, 264c and 264d.

The secondary-side circuit 262 includes a plurality of (three, in the embodiment) switching elements 265a, 265b and 265c.

In the embodiment, the compound semiconductor device according to any one of first to second embodiments is used for the switching element 251 of the PFC circuit 250, and for the switching elements 264a, 264b, 264c and 264d of the full-bridge inverter circuit 260. The PFC circuit 250 and the full-bridge inverter circuit 260 are components of the primary-side circuit 261. On the other hand, a silicon-based general MIS-FET (field effect transistor) is used for the switching elements 265a, 265b and 265c of the secondary-side circuit 262.

Sixth Embodiment

Figure 10:
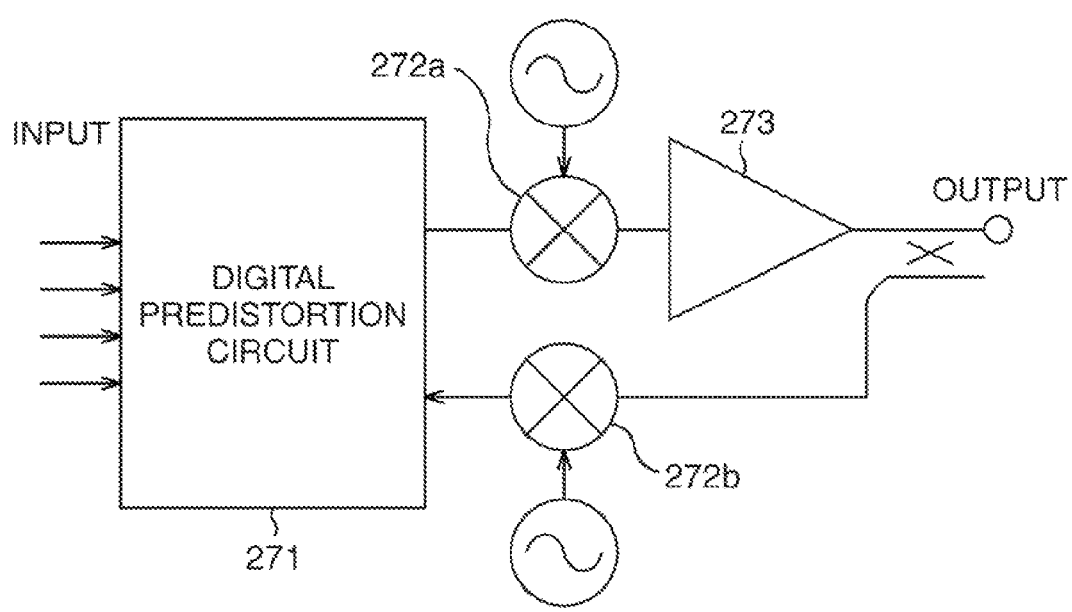
FIG. 10 is a wiring diagram illustrating a high-frequency amplifier according to a sixth embodiment.

Next, a sixth embodiment will be explained. The sixth embodiment relates to a high-frequency amplifier (high-output amplifier) equipped with a compound semiconductor device which includes a GaN-based HEMT. FIG. 10 is a wiring diagram illustrating the high-frequency amplifier according to the sixth embodiment.

The high-frequency amplifier includes a digital predistortion circuit 271, mixers 272a and 272b, and a power amplifier 273.

The digital predistortion circuit 271 compensates non-linear distortion in input signals. The mixer 272a mixes the input signal having the non-linear distortion already compensated, with an AC signal. The power amplifier 273 includes the compound semiconductor device according to any one of the first to second embodiments, and amplifies the input signal mixed with the AC signal. In the illustrated example of the embodiment, the signal on the output side may be mixed, upon switching, with an AC signal by the mixer 272b, and may be sent back to the digital predistortion circuit 271.

Composition of the compound semiconductor layers used for the compound semiconductor stacked structure is not specifically limited, and GaN, AlN, InN and so forth may be used. Also mixed crystals of them may be used.

Configurations of the gate electrode, the source electrode and the drain electrode are not limited to those in the above-described embodiments. For example, they may be configured by a single layer. The method of forming these electrodes is not limited to the lift-off process. The annealing after the formation of the source electrode and the drain electrode may be omissible, so long as the ohmic characteristic is obtainable. The gate electrode may be annealed.

In the embodiments, the substrate may be a silicon carbide (SiC) substrate, a sapphire substrate, a silicon substrate, a GaN substrate, a GaAs substrate or the like. The substrate may be any of electro-conductive, semi-insulating, and insulating ones. It is preferable to use a Si substrate (one in which the surface has a Miller index of (111) plane, for example), a SiC substrate or a sapphire substrate in view of cost. The thickness and material of each of these layers are not limited to those in the above-described embodiments.

According to the compound semiconductor devices and so forth described above, an excellent crystallinity of an electron transport layer can be obtained, even if an Fe-doped region is provided, since an appropriate initial layer is formed.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method of manufacturing a compound semiconductor device, comprising:
    forming an initial layer over a substrate;
    forming a buffer layer over the initial layer;
    forming an electron transport layer and an electron supply layer over the buffer layer;
    doping Fe to the buffer layer and the electron transport layer; and
    forming a gate electrode, a source electrode and a drain electrode over the electron supply layer,
    wherein
    the forming an initial layer comprises:
    forming a first compound semiconductor film with a flow rate ratio being a first value, the flow rate ratio being a ratio of a flow rate of an ammonia gas to a flow rate of a trimethylaluminum gas; and
    forming a second compound semiconductor film with the flow rate ratio being a second value lower than the first value over the first compound semiconductor film,
    each of the first compound semiconductor film and the second compound semiconductor film is an AlN film, and
    the electron transport layer is formed with the flow rate ratio being 10000 or higher.

2. The method of manufacturing a compound semiconductor device according to claim 1, wherein
    the first value is 100 or higher and 1000 or lower, and
    the second value is 10 or lower.

3. The method of manufacturing a compound semiconductor device according to claim 1, wherein Fe is doped to the Fe-doped region at $1\times10^{16}$ cm$^{-3}$ to $1\times10^{18}$ cm$^{-3}$.

4. The method of manufacturing a compound semiconductor device according to claim 1, wherein the second compound semiconductor film is thicker than the first compound semiconductor film.

5. The method of manufacturing a compound semiconductor device according to claim 1, wherein the electron transport layer is formed at a pressure of 60 kPa or higher.

6. The method of manufacturing a compound semiconductor device according to claim 1, wherein each of the initial layer, the buffer layer, the electron transport layer and the electron supply layer is a nitride semiconductor layer.

7. The method of manufacturing a compound semiconductor device according to claim 1, wherein the substrate is a Si substrate.

8. The method of manufacturing a compound semiconductor device according to claim 1, wherein the buffer layer comprises a plurality of AlGaN layers.

* * * * *